United States Patent
Shiota et al.

[11] Patent Number: 6,144,558
[45] Date of Patent: Nov. 7, 2000

[54] PARTS INSTALLATION STRUCTURE HAVING ELECTRONIC PART CONNECTED TO FLEXIBLE SHEET WITH CONDUCTIVE AND NON-CONDUCTIVE ADHESIVES

[75] Inventors: Naohiro Shiota, Yokohama; Rikuro Obara, Nagano, both of Japan

[73] Assignee: Minebea Co., Ltd., Nagano, Japan

[21] Appl. No.: 08/901,329

[22] Filed: Jul. 28, 1997

Related U.S. Application Data

[63] Continuation of application No. 08/626,581, Apr. 2, 1996, abandoned, which is a continuation of application No. 08/390,274, Feb. 14, 1995, abandoned, which is a continuation of application No. 08/107,010, Aug. 17, 1993, abandoned.

[30] Foreign Application Priority Data

Aug. 17, 1992 [JP] Japan .................................. 4-240034

[51] Int. Cl.[7] .................................................. H05K 1/18
[52] U.S. Cl. ........................... 361/760; 361/749; 361/751; 361/771; 361/783; 174/254; 174/259; 174/260; 257/778; 257/783; 438/118; 438/119; 29/832
[58] Field of Search ..................... 361/730, 736, 361/748–749, 752, 751, 760–761, 765, 807, 809, 811, 767, 769, 770, 771, 779, 782, 783; 174/260–263, 268, 259, 254; 29/622, 832, 834, 841, 855, 877, 881; 156/182; 228/179.1, 180.1, 180.21; 257/723, 724, 725, 778, 782, 783, 785; 428/901; 438/118, 119; 439/67, 77, 68, 70, 72, 74, 83, 84, 66, 91, 525, 526

[56] References Cited

U.S. PATENT DOCUMENTS

| | | | |
|---|---|---|---|
| 4,085,433 | 4/1978 | Baranowski | 361/744 |
| 4,139,881 | 2/1979 | Shimizu et al. | 361/760 |
| 4,339,785 | 7/1982 | Ohsawa | 361/779 |
| 4,635,354 | 1/1987 | Chrobak et al. | 29/622 |
| 4,716,500 | 12/1987 | Payne | 174/268 |
| 4,761,881 | 8/1988 | Bora et al. | 29/840 |
| 4,774,634 | 9/1988 | Tate et al. | 174/259 |
| 4,814,944 | 3/1989 | Sagawa | 361/760 |
| 4,818,823 | 4/1989 | Bradley | 361/760 |
| 4,868,637 | 9/1989 | Clements et al. | 174/88 R |
| 4,927,697 | 5/1990 | Ihill | 428/901 |
| 4,999,136 | 3/1991 | Su et al. | 428/901 |
| 5,042,971 | 8/1991 | Ambrose | 361/749 |
| 5,085,364 | 2/1992 | Ishikawa et al. | 228/180.2 |
| 5,155,904 | 10/1992 | Majd | 228/180.1 |
| 5,839,190 | 11/1998 | Sullivan | 174/259 |

FOREIGN PATENT DOCUMENTS 0130410  1/1985  European Pat. Off. .

*Primary Examiner*—Jeffrey Gaffin
*Assistant Examiner*—John B. Vigushin
*Attorney, Agent, or Firm*—Staas & Halsey LLP

[57] ABSTRACT

A present invention is to provide a thin parts installation structure and their manufacturing method. There is provided a circuit on a wiring substrate, an adhesive is painted to a selected part installation position on the wiring substrate, a conductive adhesive is painted in a position where the terminal area of electronic parts contact the wiring pattern circuits. The electronic part is put in the selected position of wiring the substrate such that the terminals of the electronic parts contact the conductive adhesive prior to curing the adhesives, and followed by both the non-conductive adhesive and conductive adhesive are stiffened.

16 Claims, 1 Drawing Sheet

6,144,558

PARTS INSTALLATION STRUCTURE HAVING ELECTRONIC PART CONNECTED TO FLEXIBLE SHEET WITH CONDUCTIVE AND NON-CONDUCTIVE ADHESIVES

This application is a continuation of application Ser. No. 08/626,581, filed Apr. 2, 1996, now abandoned, which was a continuation of Ser. No. 08/390,274 filed Feb. 14, 1995, now abandoned, which was a continuation of Ser. No. 08/107,010 filed Aug. 17, 1993, now abandoned.

BACKGROUND OF THE INVENTION

1. Field of the Invention

The present invention relates to parts installation structures and their manufacturing methods, and more particularly to a printed circuit parts installation structure for a membrane switch and its manufacturing method.

2. Description of the Prior Art

In recent years, many electronic devices have been developed. Printed-circuit boards are indispensable in a significant portion of these electronic devices.

When printed-circuit boards appeared on the market, the terminals of electronic parts, such as the semiconductor parts, were inserted in small holes, which opened to the wiring pattern of printed-circuit board. Then the printed-circuit board was dipped in a dip-tank of solder. The terminals and the wiring pattern were soldered, and the electronic circuit was assembled. However, quite recently, electronic parts were miniaturized. The method of installing electronic parts on printed-circuit boards has changed. For instance, a paste solder may be applied at fixed portions of the wiring pattern of the printed-circuit board. Then, the terminals of electronic parts, such as transistors, are brought into contact with the fixed portions, and the paste solder is melted by an infrared heating machine etc. Soldering is thus achieved between the terminals of electronic parts.

In recent years, membrane switches have been used for the switches of keyboards in personal-computers etc. In miniaturizing the keyboard, the membrane switch is helpful. Moreover, the electronic parts such as large-scale ICs and luminescence elements may be connected to the wiring pattern of a membrane switch substrate.

FIG. 2 is a cross-sectional view, showing a conventional technique for mounting electronic parts (d) on a membrane switch. The leads d' of the electronic part (perhaps a chip diode) d are fixed by a conductive adhesive (c) to a printed wiring pattern (b) on a switch sheet (a). A sealing member (e) formed of a UV stiffening material covers the membrane switch sheet (a) and the chip diode (d).

In the mounting of the parts mentioned above, the chip diode (d) is adhered onto the membrane switch sheet (a) and is covered by the sealing member (e). Therefore, the overall device becomes thick, unsuitable for use in a thin keyboard.

Moreover, both of the printed wiring pattern (b) and the electronic parts are covered by the sealing member (e). Therefore, when the printed wiring pattern (b) and the electronic parts cover a large area, a lot of sealing material is needed. The UV rays do not reach the lower side of electronic parts (d), and the UV rays do not stiffen the sealing material. To compensate for this, the membrane switch sheets are inserted into a furnace for the stiffening the sealing materials.

In addition, when a large force is applied between the membrane switch sheet (a) and the sealing member (e) or electronic parts (d), the printed circuits, which consume substantial area on the membrane switch sheet (a), may receive a large amount of damage, and the sealing number (e) or the electronic parts (d) may peel off of the membrane switch sheet (a).

In view of the aforesaid drawbacks associated with conventional parts installation structures and their manufacturing methods, it is an object of the present invention to provide a thin parts installation structure and a manufacturing method therefor.

Another object of the present invention is to provide a manufacturing method that easily stiffens adhesive materials for membrane switch keyboards, without the need for a UV stiffening process.

A further object of the present invention is to decrease the equipment cost for parts installation structures and the manufacturing method therefor.

SUMMARY OF THE INVENTION

According to the present invention, there is provided a parts installation structure having electronic parts fixed on painted circuits, comprising, electronic parts fixed on a substrate of the parts installation structure by a painted adhesive. Wiring between the circuit pattern of the part installation structure and the terminals of electronic parts is accompanied with a conductive adhesive. There is also provided a manufacturing method, comprising a step of forming circuits on the wiring substrate, a step of painting the adhesive at the installation position for the wiring substrate, a step of painting conductive adhesive where the terminals of electronic parts are to be fixed on the wiring circuit pattern, a step of placing the electronic parts on the wiring substrate at selected positions so that the terminals of the electronic parts touch the conductive adhesive (performed before the nonconductive adhesive and conductive adhesive are hardened), and a step of stiffening said nonconductive adhesive and conductive adhesive.

According to the present invention, said parts installation structure can be fabricated without increasing the height.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

An embodiment of the present invention will hereinafter be described with reference to the drawings.

Figure 1:
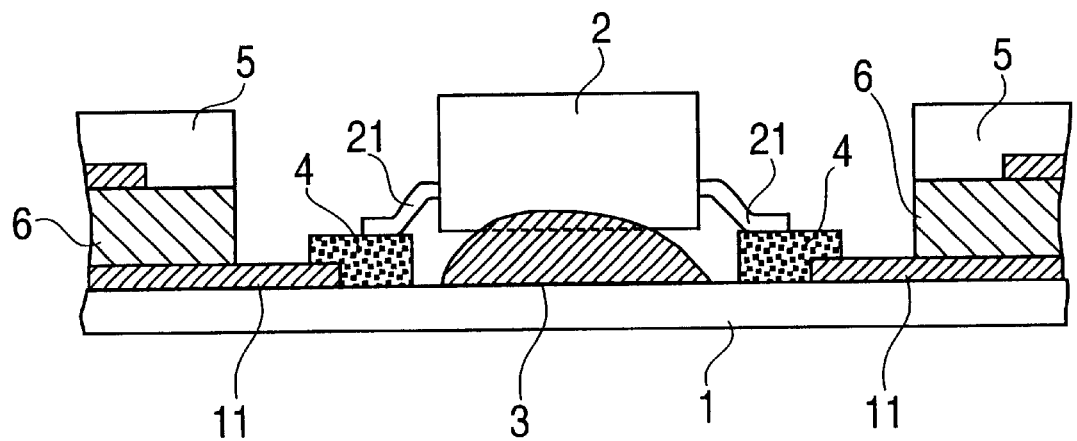
FIG. 1 is a cross-sectional view of a parts installation structure of the present invention, showing a component mounted to a membrane switch sheet.
Figure 2:
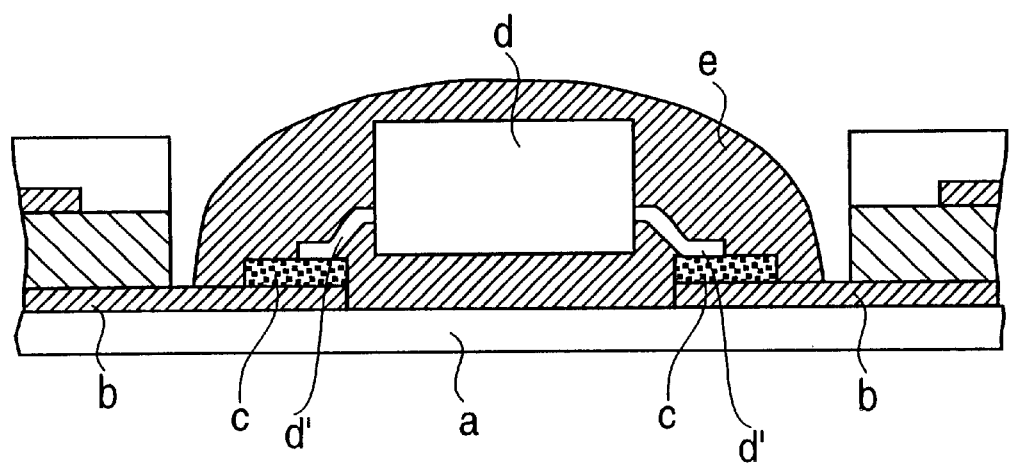
FIG. 2 is a cross-sectional view, showing a conventional mounting of an electronic part to a membrane switch.

FIG. 1 is a cross-sectional view for explaining a parts installation structure and manufacturing method thereof, according to the present invention.

A membrane switch sheet 1, which is well known, consists of two thin plastic thin sheets. The two thin plastic sheets are made from a polyester plastic film which have flexibility. A fixed wiring pattern is printed on the surface or the inside and outside thin plastic sheets which includes an electric contact point, perhaps on the inside of a thin sheet of the membrane switch.

In FIG. 1, reference numeral 11 denotes a wiring pattern on the membrane switch sheet 1 formed by printing. In order to mount the electronic parts on the membrane switch sheet 1 and to connect the leads 21 of the electronic parts to the wiring pattern 11, nonconductive adhesive 3 is painted at the sight selected for the electronic part. Conductive adhesive 4 is painted on an edge of the wiring pattern 11 and on the flexible membrane sheet 1 in the vicinity of the edge of the wiring pattern 11, as shown in FIG. 1.

If the non-conductive adhesive 3 and the conductive adhesive 4 are made from thermosetting plastic materials such as epoxy resins, the material costs for making the parts installation structure will be reduced.

Moreover, silk-printing and another printing methods can be used to paint the adhesives. Alternatively, the non-conductive adhesive 3 and the conductive adhesive 4 can be dropped from a nozzle to the selected fixing position and to the writing pattern 11, respectively.

Next, the body of the chip diode 2 is placed in contact with the non-conductive adhesive 3, and the leads 21 of the chip diode 2 are placed in contact with the conductive adhesive 4. Then, membrane switch sheet 1 with the electronic parts thereon is placed into a furnace, and heated.

Non-conductive adhesive 3 and conductive adhesive 4 are stiffened by the heating. As a result, the body of diode chip 2 fixed on the face of the membrane switch sheet 1 and the leads 21 are physically and electrically connected to the sheet 1 and the wiring pattern 11, respectively.

In FIG. 1, reference numeral 5 denotes an upper membrane switch sheet. Reference numeral 6 denotes a spacer between the upper membrane switch sheet 5 and the (lower) membrane switch sheet 1. Thus, the membrane switch is a three layer structure. The thickness of the membrane switch having three layers is only 1.4 mm.

Next, operation of the embodiment of the present invention will be described.

In the embodiment of the present invention, the adhesives are painted on the wiring substrate at selected locations corresponding to the parts to be installed. Then, the electronic parts are placed on the adhesives. After this, the adhesives are stiffened. These steps are performed so that no material covers the surfaces of the electronic parts, and so that the thickness of the membrane switch sheet is not increased. In addition, the adhesives are stiffened by heating, without using UV ray radiation.

In the above-mentioned embodiment, a membrane switch sheet with flexibility is used as the wiring substrate. However, the present invention can also be used when a rigid wiring substrate, such as an epoxy-glass sheet, or the face of a flexible flat cable serve as the wiring substrate.

Further, the adhesive by which electronic parts are bonded can be conductive, as long as a short circuit is not caused in the wiring pattern circuit.

The thermal stability of polyester resins is inferior to that of epoxy resins, but the stiffening temperature of epoxy resins is not very high. Therefore, the present invention can be used with membrane switch sheets made from a polyester film, which is cheaper than an epoxy film.

What is claimed is:

1. A parts installation structure, comprising:
    a flexible membrane sheet;
    a wiring pattern formed on the flexible membrane sheet;
    an electronic part having a terminal attached thereto, and lower and upper opposing surfaces;
    a first adhesive, which is non-conductive and formed from an epoxy resin, formed on said flexible membrane sheet, for adhering the electronic part to said flexible membrane sheet such that the lower surface of the electronic part faces the flexible membrane sheet; and
    a second adhesive which is electrically conductive and formed from an epoxy resin, the second adhesive making contact with the terminal of the electronic part and the wiring pattern to establish electrical connection between the terminal and the wiring pattern.

2. A parts installation structure according to claim 1, wherein the first adhesive does not extend above the upper surface of said electronic part.

3. A parts installation structure according to claim 1, wherein the second adhesive is located outside a circumference of the electronic part.

4. A parts installation structure according to claim 1, wherein the second adhesive does not extend above the upper surface of said electronic part.

5. A parts installation structure according to claim 1, where in the flexible membrane sheet is formed of two thin plastic sheets.

6. A parts installation structure according to claim 5, wherein the plastic sheets are formed of a polyester.

7. A parts installation structure according to claim 1, wherein the electronic part is an electronic switching part and a plurality of electronic switching parts are provided on the flexible membrane sheet to form a keyboard switching element.

8. A parts installation structure according to claim 1 wherein, the first and second adhesives are thermosetting adhesives.

9. A parts installation structure comprising:
    a flexible membrane sheet, a printed circuit formed on said flexible membrane sheet, and an electronic part adhered to said flexible membrane sheet by an adhesive, the parts installation structure being produced by the process of:
      extruding a conductive adhesive formed from an epoxy resin onto the terminal areas of the printed circuit, outside a circumference of the electronic part, by a screen printing;
      extruding a non-conductive adhesive formed from an epoxy resin onto a selected portion of the flexible membrane sheet by a screen printing;
      placing an electronic part having terminals attached thereto on the selected portion of the flexible membrane sheet such that the terminals attached to the electronic part are in electrical contact with said conductive adhesive and the body of the electronic part is in contact with the non-conductive adhesive; and
      stiffening said non-conductive and conductive adhesives.

10. A parts installation structure according to claim 9, wherein the flexible membrane sheet is formed of two thin plastic sheets.

11. A parts installation structure according to claim 10, wherein the plastic sheets are formed of a polyester.

12. A parts installation structure according to claim 9 wherein, the conductive and non conductive adhesives are thermosetting adhesives.

13. A parts installation structure comprising:
    a flexible membrane sheet;
    a wiring pattern formed on the flexible membrane sheet of said parts installation structure;
    electronic parts, having terminals, fixed on said flexible membrane sheet by a painted non-conductive adhesive formed from an epoxy resin;

said wiring pattern being fixed to said terminals of said electronic parts by a conductive adhesive formed from an epoxy resin painted on an edge of said wiring pattern and on said flexible membrane sheet in a vicinity of said edge of said wiring pattern;

wherein said non-conductive adhesive and said conductive adhesive do not cover upper surfaces of said electronic parts such that the thickness of said parts installation structure is not increased, and wherein said non-conductive adhesive is stiffened without using UV ray radiation.

14. A parts installation structure according to claim 13, wherein the flexible membrane sheet is formed of two thin plastic sheets.

15. A parts installation structure according to claim 14, wherein the plastic sheets are formed of a polyester.

16. A parts installation structure according to claim 13 wherein, the conductive and non conductive adhesives are thermosetting adhesives.

* * * * *